(12) United States Patent
Atris et al.

(10) Patent No.: US 7,102,365 B1
(45) Date of Patent: Sep. 5, 2006

(54) APPARATUS FOR CURRENT SENSING

(75) Inventors: Youssef H. Atris, Gilbert, AZ (US);
Brandt Braswell, Chandler, AZ (US);
Douglas A. Garrity, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/097,593

(22) Filed: Apr. 1, 2005

(51) Int. Cl.
*G01R 27/26* (2006.01)
*G01R 27/08* (2006.01)

(52) U.S. Cl. ..................... 324/658; 324/709
(58) Field of Classification Search ............. 324/709
See application file for complete search history.

(56) References Cited

U.S. PATENT DOCUMENTS 5,574,457 A * 11/1996 Garrity et al. .......... 341/172
5,867,054 A * 2/1999 Kotowski ................ 327/513

* cited by examiner

*Primary Examiner*—Vincent Q. Nguyen
(74) *Attorney, Agent, or Firm*—Ingrassia, Fisher & Lorenz (57) ABSTRACT

Apparatus for sensing a current across a known resistor including a switched capacitor network and an amplifier having an input coupled to an output of the switched capacitor network. The switched capacitor network is configured to sample first and second reference potentials indicating the current. The amplifier is configured to produce first and second amplified potentials at an output of the amplifier based on the first and second reference potentials.

9 Claims, 4 Drawing Sheets

APPARATUS FOR CURRENT SENSING

FIELD OF THE INVENTION

The present invention generally relates to current monitoring, and more particularly relates to a circuit for sensing current across a known resistance.

BACKGROUND OF THE INVENTION

Many portable devices perform current sensing as part of a battery current monitoring function to provide an indication of the battery charge, such as a visual bar indicating the current battery level. During this function, a current sensing circuit typically measures a voltage difference across a known resistance. One common method used for battery current monitoring utilizes a continuous time current measurement. In continuous time current measurement, the current sensing circuit typically uses a single-ended (i.e., a single voltage input to a differential amplifier) measurement that may be susceptible to noise and transients. When sensing smaller currents, as in the case in mobile communication products, the noise and transients may be reflected in the sensed current and thereby significantly affect the accuracy of the sensed current.

Mobile communication products place a premium on maximizing battery life, and measuring the current across a low known resistance minimizes the power drain on the battery during current sensing. For example, in a mobile communication product, the measured voltage difference is typically in the order of about 80 mV Full Scale, and the sensed current reflects the measured voltage difference across the low known resistance as a smaller current.

Additionally, the mobile communication product may use the sensed current to perform other functions that require an instantaneous and relatively accurate current measurement, such as in the order of about a ten (10) bit resolution. For example, the sensed current may be fed to an Analog-to-Digital (A/D) converter to produce a relatively high resolution value of the sensed current for use in a downstream microprocessor. In comparison, conventional continuous time measurements generally provide a measurement on the order of about a seven (7) bit resolution.

Further, the A/D converter, or other downstream component, coupled to the current sensing circuit, may require an input within a predetermined voltage range that is significantly greater than the measured voltage difference. Although the conventional continuous time measurements generally amplify the measured voltage difference within a single stage, the amplified output is generally limited by the size of the low known resistance. These constraints generally reduce the effectiveness of conventional continuous time measurements for mobile communication products and other devices requiring higher resolution battery current measurements.

Accordingly, a circuit for sensing current is desired having reduced power consumption. In addition, a circuit for sensing relatively low current levels is desired that minimizes circuit component size for battery current monitoring applications, such as in mobile communication products. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description.

According to various embodiments, an apparatus is provided for sensing a current across a known resistor and is well-suited for sensing current output from a battery to monitor battery current in a mobile communication handset. In a mobile communication handset implementation, the apparatus senses the current output from the battery across the known resistor and outputs an amplified. current value to an Analog-to-Digital (A/D) converter for further processing such as battery or charge level indication.

Figure 1:
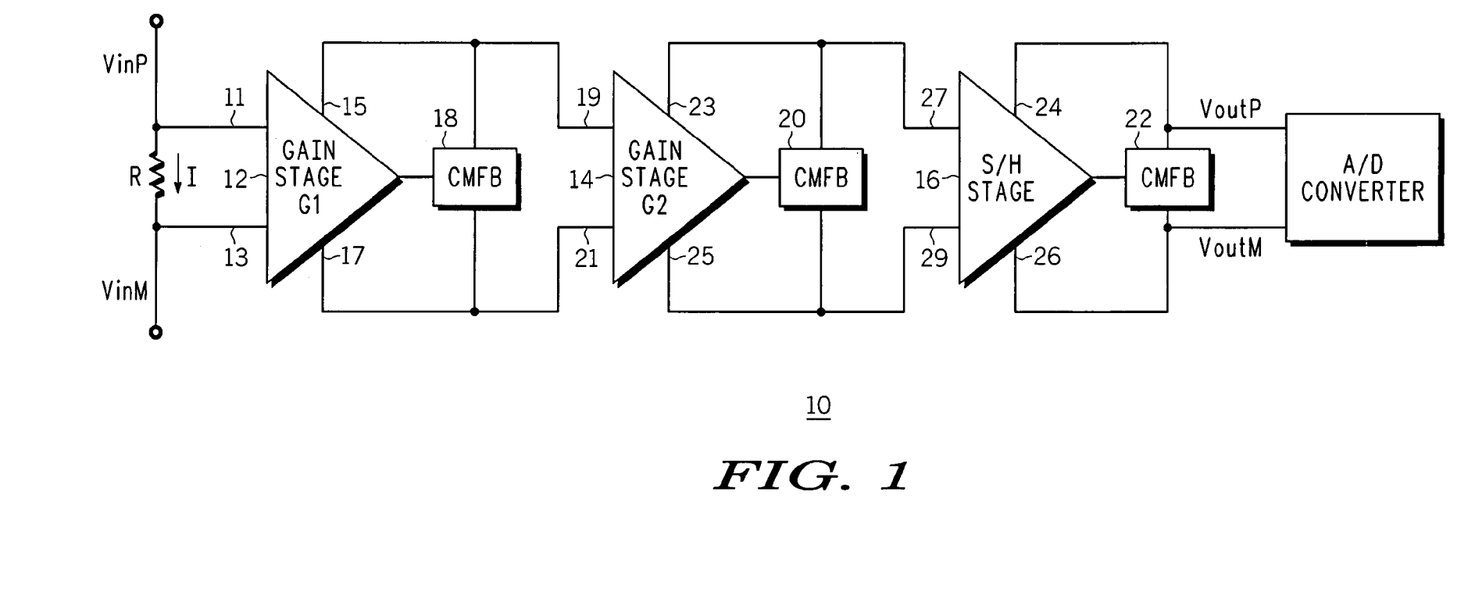
FIG. 1 is a schematic diagram of an exemplary embodiment of a current sensing circuit according to the present invention.

Referring to the drawings, FIG. 1 is a schematic diagram of an exemplary embodiment of a current sensing circuit 10 according to the present invention. Current sensing circuit 10 comprises a first gainstage (G1) 12 having first and second inputs 11, 13 configured to be coupled to first and second references potentials ($V_{inP}$, $V_{inM}$) and having first and second outputs, a second gainstage (G2) 14 having first and second inputs 19, 21 coupled, respectively, to outputs 15, 17 of first gainstage 12 and having first and second outputs 23, 25, and a sample and hold (S/H) stage 16 having first and second inputs 27, 29 coupled, respectively, to outputs 23, 25 of second gainstage 14 and having first and second outputs 24, 26. The first reference potential ($V_{inP}$) corresponds to the potential at a first terminal of the known resistor (R), and the second reference potential ($V_{inM}$) corresponds to the potential at a second terminal of the known resistor (R). When implementing the current sensing circuit 10 in a battery current monitoring or charger current monitoring circuit, current sensing circuit 10 further comprises an A/D converter 28 coupled to outputs 24, 26 of S/H stage 16.

In an exemplary embodiment, each stage 12, 14, 16 of current sensing circuit 10 is amplifier based (e.g., includes an operational amplifier) to produce an amplified voltage output from an voltage input to the stage. First gainstage 12 senses the current (I) across the known resistor (R) from the difference between the first reference potential ($V_{inP}$) and the second reference potential ($V_{inM}$) and produces a first amplified voltage output from the first and second reference potentials ($V_{inP}$, $V_{inM}$). Second gainstage 14 further amplifies the first amplified voltage output from first gainstage 12 to produce a second amplified voltage output indicating an amplified value of the current (I) sensed across the known resistor (R). In an exemplary embodiment, the second amplified voltage output is conveniently read by the A/D converter 28. S/H stage 16 samples the second amplified voltage output from second gainstage 14 and holds the second amplified voltage output for a predetermined time period (e.g., a specified settling time) sufficient for retrieval by the A/D converter 28. From the sampled values of the second amplified voltage output, a measurement of the relatively low level sensed current (I) may be derived.

Additionally, current sensing circuit 10 further comprises a first Common Mode FeedBack circuit (CMFB) 18 coupled across first and second outputs 15, 17 of first gainstage 12, a second CMFB 20 coupled across first and second outputs 23, 25 of second gainstage 14, and a third CMFB 22 coupled across first and second outputs of S/H stage 16. CMFBs are commonly used to stabilize the common-mode voltages of differential amplifiers by adjusting the common-mode output currents thereof, as appreciated by those of skill in the art. First CMFB 18 stabilizes the common-mode voltages associated with the amplifier in first gainstage 12, second CMFB 20 stabilizes the common-mode voltages associated with the amplifier in second gainstage 14, and third CMFB 22 stabilize the common-mode voltages associated with the amplifier in S/H stage 16.

Figure 2:
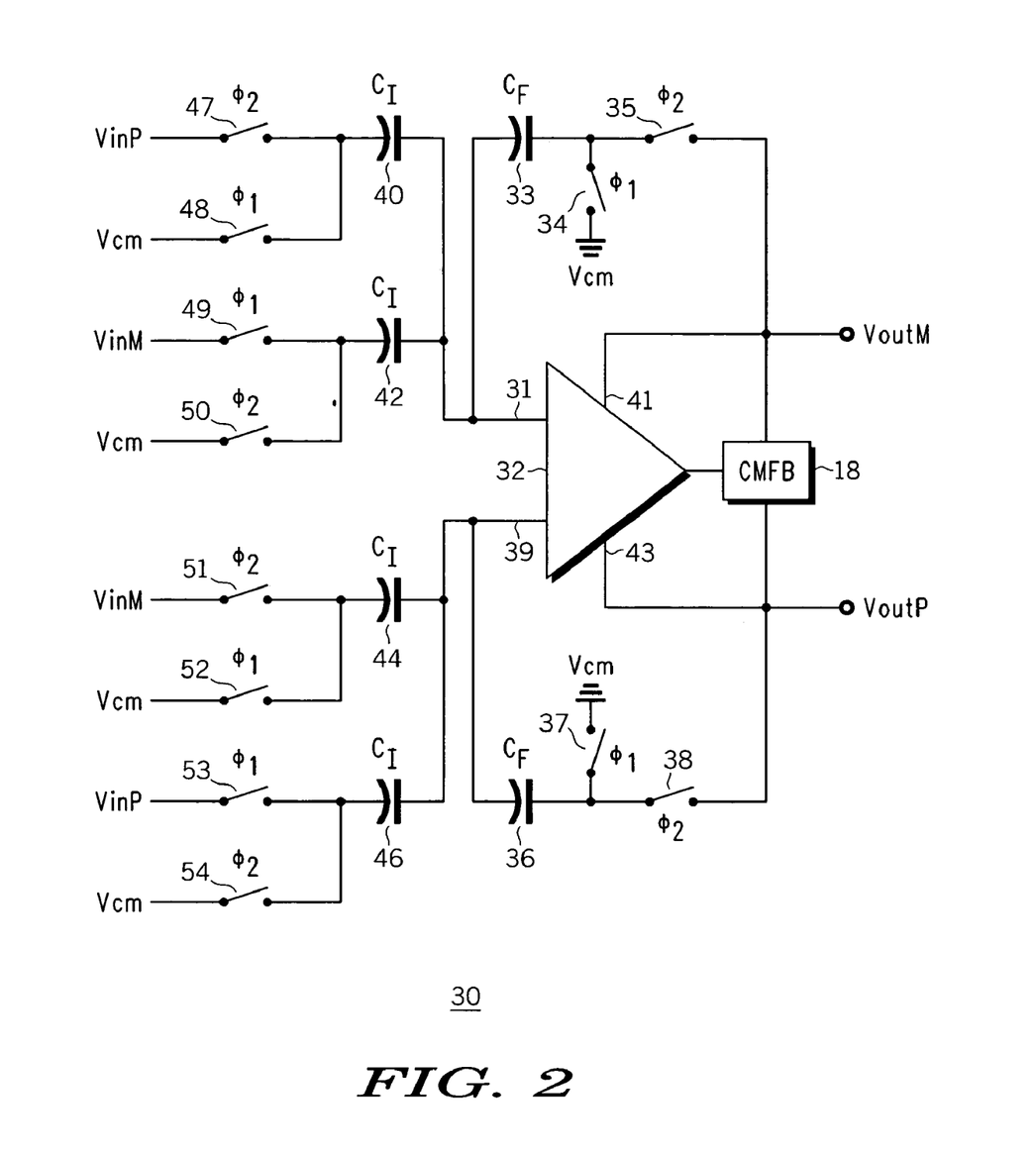
FIG. 2 is a circuit diagram of an exemplary embodiment of a gainstage for the current sensing circuit shown in FIG. 1.

FIG. 2 is a circuit diagram of an exemplary embodiment of a gainstage 30 for use in current sensing circuit 10 shown in FIG. 1. Each stage 12, 14, 16 shown in FIG. 1 may be implemented as shown in FIG. 2. Gainstage 30 comprises a first switched capacitor network, an Operational Amplifier (OPAMP) 32 having an input coupled to the first switched capacitor network and having an output, and a second switched capacitor network coupled between the input of OPAMP 32 and the output of the OPAMP 32. The input of OPAMP 32 comprises first and second voltage inputs 31, 39 of opposite polarity (e.g., $V_{in}^+$, $V_{in}^-$), and the voltage output of OPAMP 32 is coupled to first and second supply voltage inputs 41, 43 of opposite polarity (e.g., supply voltages $V^+$, $V^-$) of OPAMP 32.

The first switched capacitor network substantially instantaneously samples the first and second reference potentials ($V_{inP}$, $V_{inM}$) at the input to gainstage 30 and comprises a pair of two-phase switched capacitors coupled to each of first and second voltage inputs 31, 39 of OPAMP 32. Each two-phase switched capacitor is selectively coupled to one of the input potentials (e.g., $V_{inP}$, $V_{inM}$) during one phase and to a common-mode voltage ($V_{cm}$) during the other phase based on a pre-determined switching sequence, as described in greater detail hereinafter. The common-mode voltage ($V_{cm}$) may be any reference potential and is preferably a stable reference potential, such as ground or a band gap potential. In an exemplary embodiment, the first switched capacitor network comprises first and second input capacitors 40, 42 that each have a first electrode coupled to a first voltage input (e.g., $V_{in}^+$) of OPAMP 32, third and fourth input capacitors 44, 46 that each have a first electrode coupled to a second voltage input (e.g., $V_{in}^-$) of OPAMP 32, and first phase switches 48, 49, 52, 53 and second phase switches 47, 50, 51, 54 coupled, respectively, to a second electrode of input capacitors 40, 42, 44, 46.

While the first switched capacitor network samples the first and second reference potentials ($V_{inP}$, $V_{inM}$), the second switched capacitor network captures the input potentials received by OPAMP 32 (e.g., $V_{inM}$ and $V_{inP}$) for offset cancellation. In an exemplary embodiment, the second switched capacitor network comprises a first feedback capacitor 33 having a first electrode coupled to the first voltage input 31 (e.g., $V_{in}^+$) of OPAMP 32, a second feedback capacitor 36 having a first electrode coupled to the second voltage input 39 (e.g., $V_{in}^-$) of OPAMP 32, a first phase switch 34 coupled to a second electrode of feedback capacitor 33, a second phase switch 35 coupled to the second electrode of feedback capacitor 33, a first phase switch 37 coupled to a second electrode of feedback capacitor 36, and a second phase switch 38 coupled to the second electrode of feedback capacitor 36. Using a switched capacitor topology more readily achieves offset cancellation that, if unperformed, would generally degrade the accuracy of any sensed current by OPAMP 32.

The first and second switched capacitor networks operate using timing phases to open and close switches for initializing and scaling gainstage 30. The first switched capacitor network initializes gainstage 30 during a first timing phase ($\Phi_1$) for sensing an input potential, such as the reference potentials ($V_{inP}$, $V_{inM}$), at the input of OPAMP 32 and senses the input potentials (e.g., $V_{inP}$, $V_{inM}$) during a second timing phase ($\Phi_2$). During the first timing phase ($\Phi_1$), the second switched capacitor network captures offset voltages that may appear at the input of OPAMP 32. During the second timing phase ($\Phi_2$), the second switched capacitor network is configured to enable scaling by OPAMP 32 of the sensed input potentials ($V_{inP}$, $V_{inM}$) to produce the first amplified voltage output at an output of gainstage 30 ($V_{outM}$, $V_{outP}$) while canceling the offset voltages.

First phase switches 48, 49, 52, 53 open and close together to initialize gainstage 30. During the first timing phase ($\Phi_1$), first phase switches 48, 52 couple, respectively, input capacitors 40, 44 to $V_{cm}$, first phase switch 49 couples input capacitor 42 to $V_{inM}$, and first phase switch 53 couples input capacitor 46 to $V_{inP}$. Second phase switches 47, 50, 51, 54 open and close together to sense and remove the common mode at the input potentials (e.g., $V_{inP}$, $V_{inM}$) so as to allow processing of full scale input voltage differential signals without saturating the amplifier stages. During the second timing phase ($\Phi_2$), second phase switches 50, 54 couple, respectively, the second electrode of input capacitors 42, 46 to $V_{cm}$, second phase switch 47 couples the second electrode of input capacitor 40 to $V_{inP}$, and second phase switch 51 couples the second electrode of input capacitor 44 to $V_{inM}$. Additionally, first phase switches 48, 49, 52, 53 open during the second timing phase ($\Phi_2$). In effect, an initial configuration of the input potentials (e.g., $V_{inM}$ and $V_{inP}$) is received at the input of OPAMP 32 during the first timing phase ($\Phi_1$) for initialization and offset cancellation, and an inverted configuration of the input potentials (e.g., $V_{inP}$ and $V_{inM}$) is received at the input of OPAMP 32 during the second timing phase ($\Phi_2$) for common mode removal.

During the first timing phase ($\Phi_1$), first phase switches 34, 37 couple, respectively, the second electrode of feedback capacitors 33, 36 to $V_{cm}$, and feedback capacitors 33, 36 capture any offset voltage appearing at first and second voltage inputs 31, 39 (e.g., $V_{in}^+$ and $V_{in}^-$) of OPAMP 32. During the second timing phase ($\Phi_2$), second phase switch 35 couples the second electrode of feedback capacitor 33 to first voltage output 41 (e.g., $V^-$) of OPAMP 32 and to a first output of gainstage 30 (e.g., $V_{outM}$), and second phase switch 38 couples the second electrode of feedback capacitor 36 to second voltage output 43 (e.g., $V^+$) of OPAMP 32 and to a second output of gainstage 30 (e.g., $V_{outP}$). Additionally, first phase switches 34, 37 open during the second timing phase ($\Phi_2$) to cancel any offset voltage at voltage inputs 31, 39 of OPAMP 32 (e.g., $V_{in}^+$ and $V_{in}^-$) with the captured offset voltages of feedback capacitors 33, 36. Thus, first phase switches 34, 37 open and close together for offset cancellation of gainstage 30, and second phase switches 35,

38 open and close together for scaling of the input potentials (e.g., $V_{inP}$, $V_{inM}$) sensed by gainstage 30.

In the current sensing circuit 10 shown in FIG. 1, gainstage 30 may be implemented in each stage 14, 16 subsequent to first gainstage 12, shown in FIG. 1, such that first and second phase switches 47, 48, 49, 50, 51, 52, 53, 54 open and close in response to later timing phases (e.g., subsequent to the first and second timing phases). For example, gainstage 30 may be implemented in second gainstage 14 (FIG. 1) such that third phase switches, corresponding to first phase switches 48, 49, 52, 53 of gainstage 30, and fourth phase switches, corresponding to second phase switches 47, 50, 51, 54 of gainstage 30, of second gainstage 14 (FIG. 1) operate based on a third timing phase ($\Phi_3$) and a fourth timing phase ($\Phi_4$), respectively. The third timing phase ($\Phi_3$) and fourth timing phase ($\Phi_4$) are preferably initiated after a pre-determined delay following the initiation of the second timing phase ($\Phi_2$) for capture of the first and second output (e.g., $V_{outM}$ and $V_{outP}$) of first gainstage 12 (FIG. 1) by second gainstage 14 (FIG. 1). This pre-determined delay also provides a time period for initialization of second gainstage 14 (FIG. 1) prior to offset cancellation and scaling by second gainstage 14 (FIG. 1).

Gainstage 30 may also be implemented in S/H stage 16 (FIG. 1) such that first and second phase switches 47, 48, 49, 50, 51, 52, 53, 54 open and close in response to later timing phases (e.g., subsequent to the third and fourth timing phases). When implementing gainstage 30 in S/H stage 16 (FIG. 1), sample phase switches, corresponding to first phase switches 48, 49, 52, 53 of gainstage 30, of S/H stage 16 (FIG. 1) operate based on a sample timing phase ($\Phi_S$), and hold phase switches, corresponding to second phase switches 47, 50, 51, 54 of gainstage 30, of S/H stage 16 (FIG. 1) operate based on a hold timing phase ($\Phi_H$). The sample timing phase ($\Phi_S$) and hold timing phase ($\Phi_H$) are preferably initiated after another pre-determined delay following the initiation of the fourth timing phase ($\Phi_4$) for capture of first and second outputs 23, 25 (e.g., $V_{outP}$ and $V_{outM}$) of second gainstage 14 (FIG. 1) by S/H stage 16 (FIG. 1). This pre-determined delay also provides a time period for initialization of S/H stage 16 (FIG. 1) prior to sampling and holding by S/H stage 16 (FIG. 1).

Figure 3:
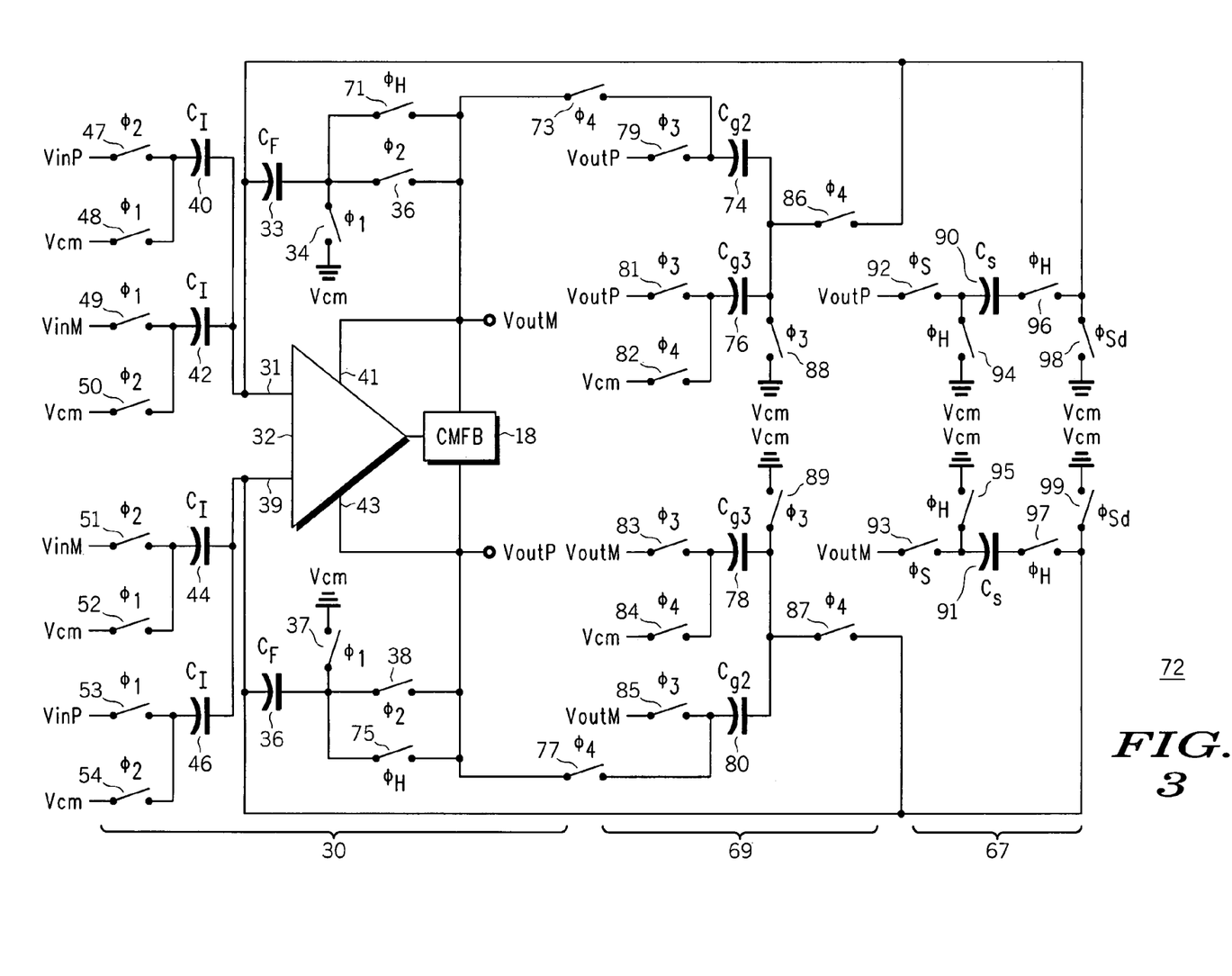
FIG. 3 is a circuit diagram of a current sensing circuit according to another exemplary embodiment of the present invention.

FIG. 3 is a circuit diagram of a current sensing circuit 72 according to another exemplary embodiment of the present invention. In this exemplary embodiment, current sensing circuit 72 senses the current (I) across the known resistor (R) shown in FIG. 1 by double sampling the first and second reference potentials ($V_{inP}$, $V_{inM}$). Current sensing circuit 72 comprises a first gainstage of the type shown in FIG. 2, having an input configured to sample the first and second reference potentials ($V_{inP}$, $V_{inM}$), a second gainstage 69 having an input coupled to the output of first gainstage 30, and an S/H stage 67 having an input coupled to an output of second gainstage 69.

Second gainstage 69 re-samples the first and second reference potentials ($V_{inP}$, $V_{inM}$), sensed at the input of first gainstage 30, to produce the second amplified voltage output at the output of second gainstage 69. In an exemplary embodiment, second gainstage 69 comprises a third switched capacitor network comprising a first gain capacitor 74, a second gain capacitor 76, a third gain capacitor 78, a fourth gain capacitor 80, third phase switches 79, 81, 83, 85 coupled, respectively, to a first electrode of gain capacitors 74, 76, 78, 80, fourth phase switches 73, 77, 82, 84 coupled, respectively, to the first electrode of gain capacitors 74, 76, 78, 80, a fourth phase switch 86 coupled to a second electrode of both of gain capacitors 74, 76, a fourth phase switch 87 coupled to a second electrode of both of gain capacitors 78, 80, a third phase switch 88 coupled to the second electrodes of both of gain capacitors 74, 76, and a third phase switch 89 coupled to the second electrodes of both of gain capacitors 78, 80. The third switched capacitor network is configured to perform the second sampling of the reference potentials ($V_{inP}$, $V_{inM}$) and scale the sample reference potentials to produce the second amplified voltage output.

After second gainstage 69 re-samples the reference potentials ($V_{inP}$, $V_{inM}$) to produce the second amplified voltage output, S/H stage 67 samples the second amplified voltage output from second gainstage 69 and holds the second amplified voltage output for a predetermined time period (e.g., specified settling time) sufficient for retrieval by the A/D converter 28 (FIG. 1). In an exemplary embodiment, S/H stage 67 comprises a first sampling capacitor 90, a second sampling capacitor 91, first and second sampling switches 92, 93 coupled, respectively, to a first electrode of sampling capacitors 90, 91, first and second hold switches 94, 95 coupled, respectively, to the first electrodes of sampling capacitors 90, 91, a third hold switch 96 having a first terminal coupled to a second electrode of first sampling capacitor 90 and having a second terminal coupled to the first voltage input 31 ($V_{in}^+$) of OPAMP 32, a fourth hold switch 97 having a first terminal coupled to a second electrode of second sampling capacitor 91 and having a second terminal coupled to the second voltage input 39 ($V_{in}^-$) of OPAMP 32, a fifth hold switch 71 having a first terminal coupled to the second electrode of first feedback capacitor 33 and having a second terminal coupled to the first output 41 (e.g., $V_{outM}$) of first gainstage 30, a sixth hold switch 75 having a first terminal coupled to the second electrode of second feedback capacitor 36 and having a second terminal coupled to the second output 43 (e.g., $V_{outP}$) of first gainstage 30, a first sampling-done switch 98 coupled to the first voltage input 31 ($V_{in}^+$) of OPAMP 32 and to the second terminal of first hold switch 96, and a second sampling-done switch 99 coupled to the second voltage input 39 ($V_{in}^-$) of OPAMP 32 and to the second terminal of second hold switch 97.

In second gainstage 69, third phase switches 79, 81, 83, 85, 88, 89 open and close together during the third timing phase ($\Phi_3$) to cancel offset that may appear at the output of first gainstage 30. During the third timing phase ($\Phi_3$), third phase switches 79, 81 couple, respectively, the first electrodes of gain capacitors 74, 76 to $V_{outP}$ from first gainstage 30, third phase switches 83, 85 couple, respectively, the first electrodes of gain capacitors 78, 80 to $V_{outM}$ from first gainstage 30, and third phase switches 88, 89 couple, respectively, the second electrodes of gain capacitors 74, 76, 78, 80 to $V_{cm}$. The fourth phase switches 73, 77, 82, 84 open and close together during the fourth timing phase ($\Phi_4$) to sense and scale the input potentials (e.g., $V_{outP}$, $V_{outM}$). During the fourth timing phase ($\Phi_4$), fourth phase switches 82, 84 couple, respectively, the first electrode of gain capacitors 76, 78 to $V_{cm}$, fourth phase switch 86 couples the second electrodes of gain capacitors 74, 76 to first voltage output 41 (e.g., $V_{outM}$) of OPAMP 32, and fourth phase switch 87 couples the second electrodes of gain capacitors 78, 80 to second voltage output 31 (e.g., $V_{outP}$) of OPAMP 32.

To sample the second amplified output voltage from second gainstage 69, sampling switches 92, 93 open and close together during the sampling timing phase ($\Phi_S$). During the sampling timing phase ($\Phi_S$), first sampling switch 92 couples the first electrode of first sampling capacitor 90 to $V_{outP}$ from first gainstage 30, and second sampling switch 93 couples the first electrode of second sampling capacitor 91 to $V_{outM}$ from first gainstage 30. S/H stage 67 thus receives the values of $V_{outP}$ and $V_{outM}$ from first gainstage 30 as further amplified by second gainstage 69.

After the second amplified voltage output (e.g., $V_{outP}$ and $V_{outM}$) is sampled from second gainstage 69, hold switches 71, 75, 94, 95, 96, 97 open and close together during the hold timing phase ($\Phi_H$) to capture the sampled values for retrieval by the A/D converter 28 (FIG. 1). During the hold timing phase ($\Phi_H$), first hold switch 94 couples the first electrode of first sampling capacitor 90 to $V_{outP}$ from first gainstage 30, second hold switch 95 couples the first electrode of second sampling capacitor 91 to $V_{outM}$ from first gainstage 30, third hold switch 96 couples the second electrode of first sampling capacitor 90 to first voltage input 31 (e.g., $V_{in}^+$) of OPAMP 32, fourth hold switch 97 couples the second electrode of second sampling capacitor 91 to second voltage input 39 (e.g., $V_{in}^-$) of OPAMP 32, fifth hold switch 71 couples the second electrode of first feedback capacitor 33 to first voltage output 41 (e.g., $V_{outM}$) of OPAMP 32, and sixth hold switch 75 couples the second electrode of second feedback capacitor 36 to second voltage output 43 (e.g., $V_{outM}$) of OPAMP 32. Additionally, sampling switches 92, 93 open to decouple sampling capacitors 90, 91 from $V_{outP}$ and $V_{outM}$, respectively, during the hold timing phase ($\Phi_H$), and S/H stage 67 thereby holds $V_{outP}$ and $V_{outM}$ for capture by the A/D converter 28 (FIG. 1). After a predetermined time period, such as sufficient for retrieval of the sampled voltage output from S/H stage 67, sampling-done switches 98, 99 open and close together during a sampling-done timing phase ($\Phi_{Sd}$) to initialize the current sensing circuit 72 for subsequent sampling. During the sampling-done phase ($\Phi_{Sd}$), first sampling-done switch 98 couples first voltage input 31 (e.g., $V_{in}^+$) of OPAMP 32 to $V_{cm}$, and second sampling-done switch 99 couples second voltage input 39 (e.g., $V_{in}^-$) of OPAMP 32 to $V_{cm}$.

In current sensing circuit 72, second gainstage 69 and S/H stage 67 both lack the OPAMPs used in second gainstage 14 (FIG. 1) and S/H stage 16 (FIG. 1) of current sensing circuit 10 (FIG. 1). Current sensing circuit 72 lacks the power consumption of OPAMPs in second gainstage 69 and S/H stage 67 while continuing to sense the current (I) across the known resistor (R) and produce an amplified voltage output indicating the current (I).

Figure 4:
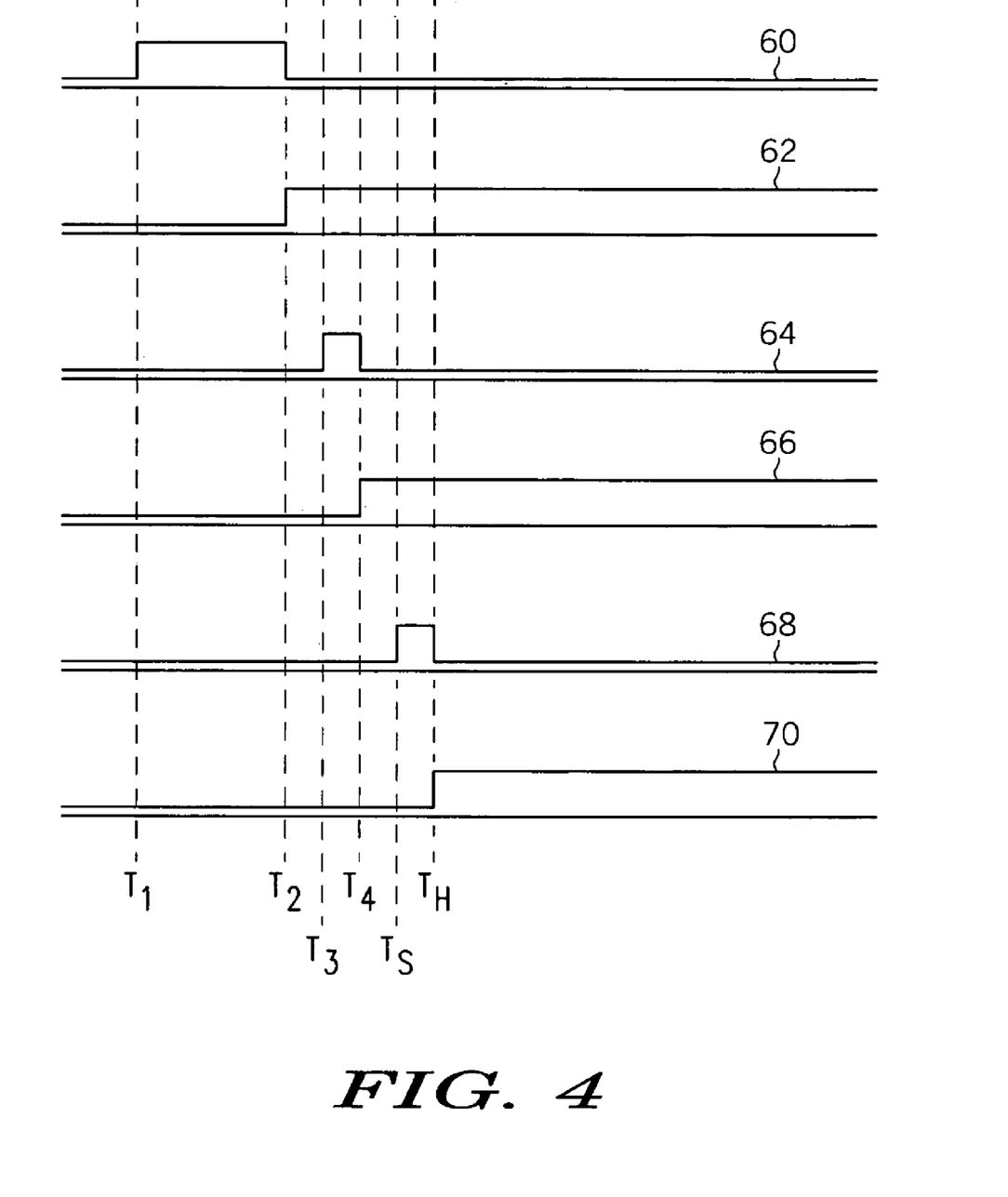
FIG. 4 is a graph illustrating a timing sequence of the current sensing circuit shown in FIG. 3.

FIG. 4 is a graph illustrating an exemplary embodiment of a timing sequence of the current sensing circuit 72 shown in FIG. 3. For each timing phase of current sensing circuit 72, the corresponding switches open in response to a low signal (e.g., about 0V) and close in response to a high signal (e.g., about 3V) over time. In this exemplary embodiment, the first timing phase ($\Phi_1$) 60 illustrates a timing sequence of first phase switches 34, 35, 48, 49, 52, 53 (FIG. 3) that initiates at a first time ($T_1$). The second timing phase ($\Phi_2$) 62 illustrates a timing sequence of second phase switches 36, 38, 47, 50, 51, 54 (FIG. 3) that initiates at a second time ($T_2$) subsequent to the first time ($T_1$). First timing phase ($\Phi_1$) 60 ends at the second time ($T_2$). The third timing phase ($\Phi_3$) 64 illustrates a timing sequence for third phase switches 79, 81, 83, 85, 88, 89 (FIG. 3) that initiates at a third time ($T_3$) subsequent to the second time ($T_2$). The fourth timing phase ($\Phi_4$) 66 illustrates a timing sequence for fourth phase switches 73, 77, 82, 84, 86, 87 (FIG. 3) that initiates at a fourth time ($T_4$) subsequent to the third time ($T_3$). The third timing phase ($\Phi_3$) 64 ends at the fourth time ($T_4$). The sampling timing phase ($\Phi_S$) 68 illustrates a timing sequence for sampling phase switches 92, 93 (FIG. 3) that initiates at sampling time ($T_S$). Hold timing phase ($\Phi_H$) 70 illustrates a timing sequence for hold phase switches 71, 75, 94, 95, 96, 97 (FIG. 3) that initiates at holding time ($T_H$). The sampling timing phase ($\Phi_S$) 68 ends at the holding time ($T_H$). While the timing sequence is described with respect to current sensing circuit 72 shown in FIG. 3, the timing sequence may also be used with current sensing circuit 10 shown in FIG. 1.

Each timing phase initiates a function associated with a particular stage of current sensing circuit 72. First timing phase ($\Phi_1$) 60 initializes first gainstage 30 (FIG. 3) and cancels offset voltages that may appear at the input of OPAMP 32 (FIG. 3). Second timing phase ($\Phi_2$) 62 samples and scales the input potentials to first gainstage 30 (FIG. 3). Third timing phase ($\Phi_3$) 64 cancels offset voltages that may appear at the input of second gainstage 69 (FIG. 3) and initializes second gainstage 69 (FIG. 3). Fourth timing phase ($\Phi_4$) 67 samples and scales the input potentials to second gainstage 69 (FIG. 3). Sampling timing phase ($\Phi_S$) 68 samples the output from second gainstage 69 (FIG. 3). Hold timing phase ($\Phi_H$) 70 holds the sampled output from second gainstage 69 (FIG. 3) for a pre-determined time period, such as a time period sufficient for capture by the A/D converter 28 (FIG. 1).

The current sensing circuits of the present invention utilize switched capacitor networks to sense the current across the known resistor with greater accuracy than conventional current sensing circuits. Additionally, using a two-stage gain (e.g., the first and second gainstages) in the current sensing circuits of the present invention decreases capacitor sizes of the switched capacitor networks. The decrease capacitor sizes make these current sensing circuits attractive for implementation in mobile communication products where smaller component size is desirable.

In an exemplary embodiment, a circuit for sensing a current comprises a switched capacitor network and an amplifier having an input coupled to an output of the switched capacitor network. The switched capacitor network is configured to sample first and second reference potentials indicating the current. The amplifier is configured to produce first and second amplified potentials at an output of the amplifier based on the first and second reference potentials.

In another exemplary embodiment, a circuit for sensing a current comprises a first gainstage comprising a first switched capacitor network, a second gainstage comprising a second switched capacitor network coupled to the first gainstage, an S/H stage having an input coupled to the output of the second gainstage and having an output, and an A/D converter coupled to the output of the S/H stage. The first switched capacitor network is configured to sense first and second reference potentials indicating the current. The second gainstage is configured to produce first and second amplified reference potentials from the first and second reference potentials. The S/H stage is configured to obtain first and second sampled potentials from the first and second reference potentials for a predetermined time period. The A/D converter is configured to receive the first and second sampled potentials from the S/H stage.

In yet another exemplary embodiment, a circuit for sensing a current comprises a first switched capacitor network having an output, an amplifier having an input coupled to the output of the first switched capacitor network and having an output, a second switched capacitor network having an input coupled to the output of the amplifier and having an output coupled to the input of the amplifier, and an S/H stage having an input coupled to the output of the amplifier. The first switched capacitor network is configured to sample first and second reference potentials indicating the current. The amplifier is configured to produce a first amplified potential from the first and second reference potentials. The second switched capacitor network is configured to produce a second amplified potential from the first amplified potential. The S/H stage is configured to produce a sampled amplified potential from the second amplified potential and hold the sampled amplified potential for a pre-determined time period.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A circuit for sensing a current, the circuit comprising:
    a first switched capacitor network comprising a first set of capacitors, said first switched capacitor network having an output and having an input configured to sample each of first, second, and third reference potentials across a different capacitor of said first set of capacitors during each of two phases, said first and second reference potentials indicating the current;
    a second switched capacitor network comprising a second set of capacitors exclusive of said first set of capacitors, said second switched capacitor network having a first terminal coupled to said input of said amplifier and having a second terminal coupled to said output of said amplifier, said second switched capacitor network configured to cancel an offset voltage at said input of said amplifier; and
    an amplifier having an output and having an input coupled to said output of said first switched capacitor network, said amplifier configured to produce first and second amplified potentials at said output of said amplifier based on said first and second reference potentials.

2. A circuit according to claim 1, wherein said input of said amplifier comprises a first input and a second input; and
    wherein said first switched capacitor network comprises:
        a first switchable capacitor having a first electrode coupled to said first input of said amplifier and a second electrode configured to couple to a third reference potential in a first phase and to said first reference potential in a second phase;
        a second switchable capacitor having a first electrode coupled to said first input of said amplifier and having a second electrode configured to couple to said second reference potential in said first phase and to said third reference potential in said second phase;
        a third switchable capacitor having a first electrode coupled to said second input of said amplifier and having a second electrode configured to couple to said third reference potential in said first phase and to said second reference potential in said second phase; and
        a fourth switchable capacitor having a first electrode coupled to said second input of said amplifier and having a second electrode configured to couple to said first reference potential in said first phase and to said third reference potential in said second phase.

3. A circuit according to claim 2, wherein said first switched capacitor network comprises:
    a first switch having a first terminal coupled to said second electrode of said first switchable capacitor and having a second terminal coupled to said first reference potential, said fit switch configured to couple said first terminal of said first switch with said second terminal of said first switch in said second phase; and
    a second switch having a first terminal coupled to said second electrode of said first switchable capacitor and having a second terminal coupled to said third reference potential, said second switch configured to couple said first terminal of said second switch with said second terminal of said second switch in said first phase;
    wherein said second switchable capacitor comprises:
    a third switch having a first terminal coupled to said second electrode of said second switchable capacitor and having a second terminal coupled to said second reference potential, said third switch configured to couple said first terminal of said third switch with said second terminal of said third switch in said first phase; and
    a fourth switch having a first terminal coupled to said second electrode of said second switchable capacitor and having a second terminal coupled to said third reference potential, said fourth switch configured to couple said first terminal of said fourth switch with said second terminal of said fourth switch in said second phase;
    wherein said third switchable capacitor comprises:
    a fifth switch having a first terminal coupled to said second electrode of said third switchable capacitor and having a second terminal coupled to said second reference potential, said fifth switch configured to couple said first terminal of said fifth switch to said second terminal of said fifth switch in said second phase; and
    a sixth switch having a first terminal coupled to said second electrode of said third switchable capacitor and having a second terminal coupled to said third reference potential, said sixth switch configured to couple said first terminal of said sixth switch to said second terminal of said sixth switch in said first phase; and
    wherein said fourth switchable capacitor comprises:
    a seventh switch having a first terminal coupled to said second electrode of said fourth switchable capacitor and having a second terminal coupled to said first reference potential, said seventh switch configured to couple said first terminal of said seventh switch to said second terminal of said seventh switch in said first phase; and
    an eighth switch having a first terminal coupled to said second electrode of said fourth switchable capacitor and having a second terminal coupled to said third reference potential, said eighth switch configured to couple said first terminal of said eighth switch to said second terminal of said eighth switch in said second phase.

4. A circuit according to claim 1, wherein said input of said amplifier comprises first and second inputs, and said output of said amplifier comprises first and second outputs; and wherein said second switched capacitor network comprises:

a first switchable capacitor having a first electrode coupled to said first input of said amplifier and having a second electrode coupled to a third reference potential in a first phase and to said first output of said amplifier in a second phase; and a second switchable capacitor having a first electrode coupled to said second input of said amplifier and having a second electrode coupled to said third reference potential in said first phase and to said second output of said amplifier in said second phase.

5. A circuit according to claim 4, wherein said first switched capacitor network comprises:

a first switch having a first terminal coupled to said second electrode of said first switchable capacitor and having a second terminal coupled to said third reference potential, said first switch configured to couple said first terminal of said first switch with said second terminal of said first switch in said first phase; and a second switch having a first terminal coupled to said second electrode of said first switchable capacitor and having a second terminal coupled to said first output of said amplifier, said second switch configured to couple said first terminal of said second switch to said second terminal of said second switch in said second phase; and wherein said second switchable capacitor comprises:

a third switch having a first terminal coupled to said second electrode of said second switchable capacitor and having a second terminal coupled to said third reference potential, said third switch configured to couple said first terminal of said third switch with said second terminal of said third switch in said first phase; and a fourth switch having a first terminal coupled to said second electrode of said second switchable capacitor and having a second terminal coupled to said second output of said amplifier, said second switch configured to couple said first terminal of said fourth switch to said second terminal of said fourth switch in said second phase.

6. A circuit according to claim 1 further comprising a Common Mode FeedBack circuit (CMFB) coupled to said output of said amplifier.

7. A circuit for sensing a current, the circuit comprising:

a first switched capacitor network comprising a first set of capacitors, said first switched capacitor network having an output and configured to sample first, second, and third reference potentials across a different capacitor of said first set of capacitors during each of two phases, said first and second reference potentials indicating the current;

an amplifier having an input coupled to said output of said first switched capacitor network and having an output, said amplifier configured to produce first and second amplified potentials from said first and second reference potentials;

a second switched capacitor network comprising a second set of capacitors exclusive of said first set of capacitors, said second switched capacitor network having an input coupled to said output of said amplifier and having an output coupled to said input of said amplifier, said second switched capacitor network configured to produce third and fourth amplified potentials from said first and second amplified potentials via said amplifier at said output of said amplifier; and an S/H stage having an input coupled to said output of said amplifier and configured to produce a sampled potential from said third and fourth amplified potentials and hold said sampled amplified potential for a predetermined time period.

8. A circuit according to claim 7, further comprising:

an amplifier having an input coupled to said first switched capacitor network and having an output; and a third switched capacitor network having a first terminal coupled to said input of said amplifier and having a second terminal coupled to said output of said amplifier, said third switched capacitor network configured to cancel a first offset voltage at said input of said amplifier during a first phase; and wherein said first switched capacitor network is further configured to sample said first and second reference potentials during a second phase, and said amplifier is configured to scale said first and second reference potentials to produce said first and second amplified potentials at said output.

9. A circuit according to claim 8 further comprising a fourth switched capacitor network having a first terminal coupled to said output of said amplifier and having a second terminal coupled to said input of said amplifier, said fourth switched capacitor network configured to cancel a second offset voltage at said input of said second switched capacitor network during a third phase; and wherein said second switched capacitor network is further configured to produce said third and fourth amplified potentials during a fourth phase.

* * * * *

UNITED STATES PATENT AND TRADEMARK OFFICE
CERTIFICATE OF CORRECTION

| | | |
|---|---|---|
| PATENT NO. | : 7,102,365 B1 | Page 1 of 1 |
| APPLICATION NO. | : 11/097593 | |
| DATED | : September 5, 2006 | |
| INVENTOR(S) | : Atris et al. | |

It is certified that error appears in the above-identified patent and that said Letters Patent is hereby corrected as shown below:

Column 10, line 9, "fit" should be changed to --first--.

Signed and Sealed this

Twenty-sixth Day of June, 2007

JON W. DUDAS
*Director of the United States Patent and Trademark Office*